(12) United States Patent
Wada

(10) Patent No.: US 12,512,333 B2
(45) Date of Patent: Dec. 30, 2025

(54) CLEANING APPARATUS

(71) Applicant: DISCO CORPORATION, Tokyo (JP)

(72) Inventor: Kentaro Wada, Tokyo (JP)

(73) Assignee: DISCO CORPORATION, Tokyo (JP)

(*) Notice: Subject to any disclaimer, the term of this patent is extended or adjusted under 35 U.S.C. 154(b) by 466 days.

(21) Appl. No.: 18/155,328

(22) Filed: Jan. 17, 2023

(65) Prior Publication Data

US 2023/0294141 A1 Sep. 21, 2023

(30) Foreign Application Priority Data

Feb. 8, 2022 (JP) ................... 2022-017645

(51) Int. Cl.
*H01L 21/67* (2006.01)
*B08B 1/36* (2024.01)
*B08B 3/02* (2006.01)

(52) U.S. Cl.
CPC .......... *H01L 21/67051* (2013.01); *B08B 1/36* (2024.01); *B08B 3/022* (2013.01)

(58) Field of Classification Search
CPC ..... B24B 53/017; B24B 53/095; B24B 55/02; B24B 55/12; H01L 21/67051; H01L 21/6704; H01L 21/67046; H01L 21/67028; H01L 21/67023; H01L 21/67017; A46B 13/008; B08B 1/36; B08B 3/02; B08B 3/022; B08B 3/04
See application file for complete search history.

(56) References Cited

U.S. PATENT DOCUMENTS 4,382,739 A * 5/1983 Mack ................ H01L 21/68742
414/217
2018/0337072 A1* 11/2018 Nakano ............ H01L 21/67219

FOREIGN PATENT DOCUMENTS

JP 2003229382 A 8/2003

OTHER PUBLICATIONS

JP-2019186497-A Oct. 24, 2019 Yang Yunfeng (Year: 2019).*

* cited by examiner

Primary Examiner — Brian D Keller
Assistant Examiner — John C Merino
(74) Attorney, Agent, or Firm — GREER BURNS & CRAIN, LTD.

(57) ABSTRACT

A cleaning apparatus for cleaning a workpiece includes a holding unit for holding an outer circumferential portion of the workpiece thereon, a rotating mechanism for rotating the holding unit, and a cleaning unit for cleaning a reverse side of the workpiece. The cleaning unit includes a cleaning member for contacting the reverse side of the workpiece and a drive mechanism for moving the cleaning member toward and away from the reverse side of the workpiece.

12 Claims, 5 Drawing Sheets

CLEANING APPARATUS

BACKGROUND OF THE INVENTION

Field of the Invention

The present invention relates to a cleaning apparatus for cleaning a workpiece.

Description of the Related Art

A plurality of device chips each including a device are manufactured by dividing wafers with devices constructed thereon into individual pieces as device chips. A packaged substrate is produced by mounting a plurality of device chips on a predetermined base substrate and covering the mounted device chips with an encapsulating material made of resin, i.e., a molding resin. The packaged substrate is divided into individual pieces as packaged devices that include the respective device chips. The device chips and the packaged devices will be incorporated into various electronic appliances such as cell phones and personal computers.

Various processing apparatuses are used to divide workpieces such as wafers or packaged substrates. For example, a workpiece may be processed by a cutting apparatus that cuts the workpiece with an annular cutting blade cutting thereinto, a laser processing apparatus that processes the workpiece with a laser beam applied thereto, a plasma treating apparatus that performs plasma etching on the workpiece with a plasma gas supplied thereto, or other apparatuses. When a workpiece is processed by a processing apparatus, foreign matter such as particles of dirt or dust that are present in the processing apparatus and debris or swarf that is produced from the workpiece as it is processed may be deposited on the workpiece. The processing apparatus incorporates a cleaning apparatus for cleaning the workpiece that has been processed. For example, JP 2003-229382A discloses a cutting apparatus incorporating a cleaning apparatus or a cleaning mechanism that includes a spinner table for holding and rotating a workpiece and a nozzle for supplying cleaning water to the workpiece on the spinner stable. The cleaning apparatus cleans the workpiece with the cleaning water to wash away foreign matter deposited on the workpiece, thereby preventing the workpiece from being contaminated by foreign matter.

SUMMARY OF THE INVENTION

For processing a workpiece with a processing apparatus, a plurality of workpieces are stored in a cassette, and the cassette is set on the processing apparatus. Then, the processing apparatus takes one workpiece at a time from the cassette, and processes the workpiece. The processed workpiece is then cleaned by a cleaning apparatus incorporated in the processing apparatus, and thereafter stored back in the cassette. Specifically, the cleaning apparatus cleans the workpiece by holding the workpiece on the spinner table, rotating the spinner table to rotate the workpiece, and supplying a cleaning liquid from a nozzle disposed above the workpiece to an upper surface, i.e., a face side, of the workpiece.

However, while the workpiece is cleaned, the workpiece has its lower surface, i.e., its reverse side, held on the spinner stable. Therefore, when the cleaning apparatus cleans the workpiece, the reverse side of the workpiece is not supplied with the cleaning liquid, and hence, foreign matter deposited on the reverse side of the workpiece is less liable to be removed. As a result, the workpiece may be contaminated by foreign matter remaining on the reverse side of the workpiece. When the workpiece with foreign matter deposited thereon is introduced into the cassette, the deposited foreign matter may be scattered around and deposited on other workpieces stored in the cassette.

In view of the above difficulties, it is an object of the present invention to provide a cleaning apparatus for cleaning a workpiece to reliably remove foreign matter deposited on the workpiece.

In accordance with an aspect of the present invention, there is provided a cleaning apparatus for cleaning a workpiece, including a holding unit for holding an outer circumferential portion of the workpiece thereon, a rotating mechanism for rotating the holding unit, and a cleaning unit for cleaning a reverse side of the workpiece. The cleaning unit includes a cleaning member for contacting the reverse side of the workpiece and a drive mechanism for moving the cleaning member toward and away from the reverse side of the workpiece.

Preferably, the drive mechanism rotates the cleaning member. Preferably, the holding unit includes a clamp that is movable selectively into a securing position for securing the workpiece and a releasing position for releasing the workpiece, and a lock mechanism for locking the clamp placed in the securing position. Preferably, the cleaning unit further includes a nozzle for supplying a fluid to the cleaning member. Further preferably, the workpiece includes a wafer, a sheet fixed to the wafer, and an annular frame supporting the wafer through the sheet, the holding unit holds the frame thereon, and the cleaning unit cleans the sheet.

The cleaning apparatus according to the aspect of the present invention includes the cleaning unit that is capable of cleaning the reverse side of the workpiece. Consequently, foreign matter that may have been deposited on the reverse side of the workpiece is reliably removed, so that the workpiece is prevented from being contaminated by foreign matter.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
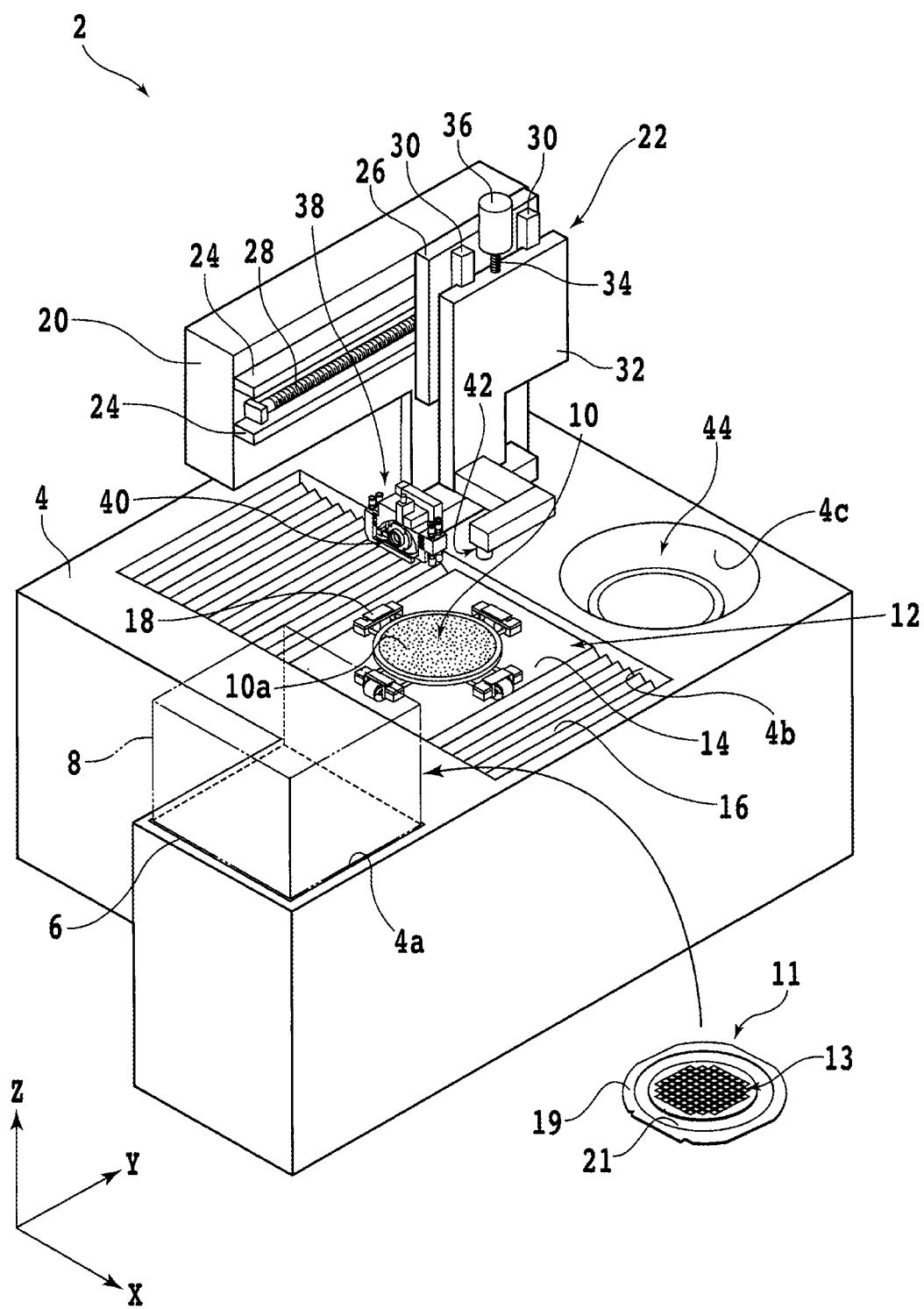
FIG. 1 is a perspective view of a cutting apparatus.

A preferred embodiment of the present invention will be described hereinbelow with reference to the accompanying drawings. First, a structural example of a processing apparatus, e.g., a cutting apparatus, incorporating a cleaning apparatus, i.e., a cleaning mechanism, according to the present embodiment will be described below. FIG. 1 illustrates the cutting apparatus, which is denoted by 2, in perspective. In FIG. 1, the cutting apparatus 2 is illustrated in connection to an XYZ coordinate system having an X-axis, a Y-axis, and a Z-axis. The X-axis represents X-axis directions (processing feed directions, first horizontal directions, or forward and rearward directions), and the Y-axis represents Y-axis directions (indexing feed directions, second horizontal directions, or leftward and rightward directions), the X-axis and the Y-axis extending perpendicularly to each other. The Z-axis represents Z-axis directions (vertical directions, upward and downward directions, or heightwise directions). The Z-axis extends perpendicularly to the X-axis and the Y-axis.

The cutting apparatus 2 includes a base 4 supporting thereon and housing therein various components of the cutting apparatus 2. The base 4 has an upwardly open rectangular opening 4a defined in an upper surface of a front corner thereof. A cassette support rest, i.e., a cassette elevator, 6 is vertically movably disposed in the opening 4a. The cassette support rest 6 is coupled to a lifting and lowering mechanism, not illustrated, that selectively lifts and lowers the cassette support rest 6 along the Z-axis. A cassette 8 for storing therein a plurality of workpieces, i.e., pieces to be processed and cleaned, 11 that are to be processed by the cutting apparatus 2 is set on the cassette support rest 6. In FIG. 1, only the contour of the cassette 8 is illustrated for the sake of brevity. Each of the workpieces 11 is a workpiece to be processed by a processing unit 38 to be described later, and is also a workpiece to be cleaned by a cleaning apparatus 44 to be described later.

Figure 2:
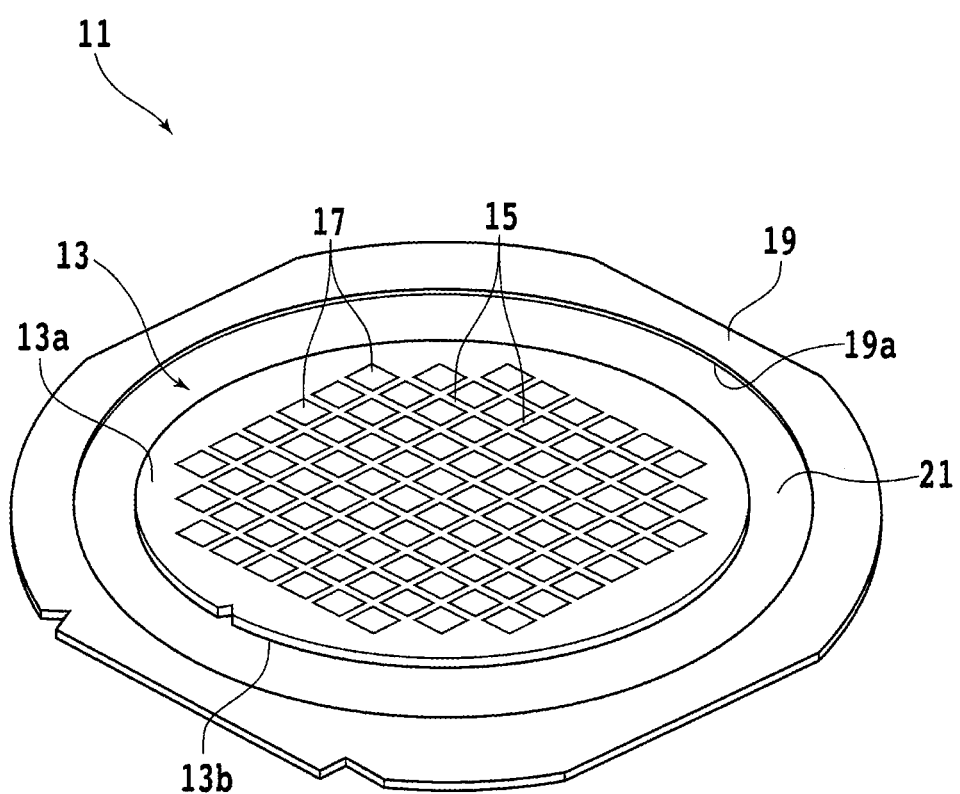
FIG. 2 is a perspective view of a workpiece.

FIG. 2 illustrates the workpiece 11 in perspective. The workpiece 11 includes, for example, a disk-shaped wafer 13 made of a semiconductor material such as monocrystalline silicon. The wafer 13 has a face side, i.e., a first surface, 13a and a reverse side, i.e., a second surface, 13b that lie generally parallel to each other and that face in opposite directions. The face side 13a of the wafer 13 has a plurality of rectangular areas demarcated by a plurality of streets, i.e., projected dicing lines, 15 that are established in a grid pattern on the face side 13a. Devices 17 such as integrated circuits (ICs), large-scale-integration (LSI) circuits, light emitting diodes (LEDs), or microelectromechanical systems (MEMS) devices are constructed in the respective areas demarcated by the streets 15 on the face side 13a of the wafer 13. The wafer 13 will be divided along the streets 15 into a plurality of individual pieces as device chips including the respective devices 17. The wafer 13 is not limited to any particular materials, shapes, structures, sizes, etc. The wafer 13 may be, for example, a substrate made of a semiconductor other than silicon, such as GaAs, InP, GaN, or Sic, or made of glass, ceramic, resin, metal, or the like. The devices 17 are not limited to any particular kinds, quantities, shapes, structures, sizes, layouts, etc.

The wafer 13 is supported on an annular frame 19. The frame 19 is made of a metal such as stainless steel (SUS) and has an opening 19a defined centrally therein and extending thicknesswise through the frame 19. The opening 19a is larger in diameter than the wafer 13. The wafer 13 that is positioned centrally in the opening 19a and the frame 19 are joined together by a sheet 21 securely affixed to both of them. The sheet 21 is, for example, a tape having a circular film-like base and an adhesive layer, i.e., a glue layer, deposited on the base. The base is made of a resin such as polyolefin, polyvinyl chloride, or polyethylene terephthalate. The adhesive layer is made of an epoxy-based adhesive, an acryl-based adhesive, a rubber-based adhesive, or the like. The adhesive layer may alternatively be made of an ultraviolet-curable resin that can be cured upon exposure to ultraviolet rays.

With the wafer 13 positioned centrally in the opening 19a, the sheet 21 has a central portion affixed to the reverse side 13b of the wafer 13 and an outer circumferential portion affixed to the frame 19. The wafer 13 is thus supported on the frame 19 by the sheet 21. The wafer 13, the frame 19, and the sheet 21 thus assembled together jointly make up the workpiece 11, which may also be referred to as a wafer unit or a frame unit. The cassette 8 illustrated in FIG. 1 stores therein a plurality of workpieces 11 thus constructed, as described above.

Each of the workpieces 11 is not limited to the above structural details. Instead of the wafer 13, a packaged substrate such as a chip size package (CSP) substrate or a quad flat non-leaded (QFN) package substrate may be supported on the frame 19. The packaged substrate is fabricated by encapsulating a plurality of device chips mounted on a base substrate with a resin layer, i.e., a molded resin layer. The packaged substrate will be divided into individual pieces as a plurality of packaged devices each having a packaged device chip. The wafer 13 and the packaged substrate may not be supported on the frame 19. According to the latter modification, the wafer 13 or the packaged substrate itself becomes a workpiece 11.

The base 4 has a rectangular opening 4b defined in the upper surface thereof laterally of the opening 4a and having a longitudinal axis extending along the X-axis. A chuck table, i.e., a holding table, 10 for holding the workpiece 11 thereon is disposed in the opening 4b. The chuck table 10 has an upper flat surface that lies generally parallel to a horizontal plane or XY plane defined by the X-axis and the Y-axis and that functions as a holding surface 10a for holding the workpiece 11 thereon. The holding surface 10a is fluidly connected to a suction source, not illustrated, such as an ejector through a suction channel, not illustrated, defined in the chuck table 10 and a valve, not illustrated.

The chuck table 10 is coupled to a moving unit 12. The moving unit 12 is, for example, a ball-screw-type moving mechanism that includes an X-axis ball screw, not illustrated, extending along the X-axis and an X-axis stepping motor, not illustrated, for rotating the X-axis ball screw about its longitudinal central axis. The moving unit 12 also includes a table cover 14 surrounding the chuck table 10. The table cover 14 is joined to a bellows-shaped dust-proof, drip-proof cover 16 that is disposed forwardly and rearwardly of the table cover 14 and that is extensible and contractible along the X-axis. The table cover 14 and the dust-proof, drip-proof cover 16 cover the components, i.e., the X-axis ball screw, the X-axis stepping motor, etc., of the moving unit 12.

The moving unit 12 moves the chuck table 10 and the table cover 14 along the X-axis. The chuck table 10 is also coupled to a rotary actuator, not illustrated, such as an electric motor for rotating the chuck table 10 about its vertical central axis generally parallel to the Z-axis. A plurality of clamps 18 for gripping and securing an outer circumferential portion, i.e., the frame 19, of the workpiece 11 on the chuck table 10 are disposed at equal angular intervals around the chuck table 10.

An upstanding support structure 20 is mounted on the upper surface of the base 4 adjacent to the opening 4b. The support structure 20 has an upper portion extending along the Y-axis in overhanging relation to the opening 4b. The upper portion of the support structure 20 supports a moving unit 22 on a front surface thereof that faces in the forward direction along the X-axis. The moving unit 22 is, for example, a ball-screw-type moving mechanism.

Specifically, the moving unit 22 includes a pair of Y-axis guide rails 24 fixed to the front surface of the upper portion of the support structure 20. The Y-axis guide rails 24 extend along the Y-axis and generally parallel to each other. The moving unit 22 also includes a Y-axis movable plate 26 shaped as a flat plate and slidably mounted on the Y-axis guide rails 24. A nut, not illustrated, is mounted on a reverse side, i.e., a rear surface, of the Y-axis movable plate 26 that faces in the rearward direction along the X-axis. The nut is operatively threaded over a Y-axis ball screw 28 disposed between the Y-axis guide rails 24 and extending along the Y-axis. The Y-axis ball screw 28 has an end coupled to a Y-axis stepping motor, not illustrated, for rotating the Y-axis ball screw 28 about its longitudinal central axis. When the Y-axis stepping motor is energized, it rotates the Y-axis ball screw 28 about its longitudinal central axis, causing the nut to move the Y-axis movable plate 26 along the Y-axis guide rails 24 in the Y-axis directions.

A pair of Z-axis guide rails 30 are fixed to a face side, i.e., a front surface, of the Y-axis movable plate 26 that faces in the forward direction along the X-axis. The Z-axis guide rails 30 extend along the Z-axis and generally parallel to each other. A Z-axis movable plate 32 shaped as a flat plate is slidably mounted on the Z-axis guide rails 30. A nut, not illustrated, is mounted on a reverse side, i.e., a rear surface, of the Z-axis movable plate 32 that faces in the rearward direction along the X-axis. The nut is operatively threaded over a Z-axis ball screw 34 disposed between the Z-axis guide rails 30 and extending along the Z-axis. The Z-axis ball screw 34 has an end coupled to a Z-axis stepping motor 36 for rotating the Z-axis ball screw 34 about its longitudinal central axis. When the Z-axis stepping motor 36 is energized, it rotates the Z-axis ball screw 34 about its longitudinal central axis, causing the nut to move the Z-axis movable plate 32 along the Z-axis guide rails 30 in the Z-axis directions.

The Z-axis movable plate 32 has a lower portion to which there is fixed a processing unit, i.e., a cutting unit, 38 for cutting the workpiece 11 on the chuck table 10. The processing unit 38 includes a cylindrical spindle, not illustrated, extending along the Y-axis and an annular cutting blade 40 mounted on a distal end, i.e., an end, of the spindle to cut the workpiece 11, i.e., the wafer 13, on the chuck table 10. The spindle has a proximal end, i.e., the other end, coupled to a rotary actuator, not illustrated, such as an electric motor for rotating the spindle about its longitudinal central axis.

The cutting blade 40 is an annular processing tool for cutting the workpiece 11 by incising the workpiece 11. The cutting blade 40 is made of abrasive grains of diamond, cubic boron nitride (cBN), or the like that are bound together by a bonding material, i.e., a binder. Specific details of the size, abrasive grain material, abrasive gain size, bonding material, etc., of the cutting blade 40 are selected depending on the material of the workpiece 11 to be processed, details of the processing of the workpiece 11, processing conditions, etc. The cutting blade 40 may be a hub-type cutting blade which is also known as a hub blade. The hub blade is of a structure that integrally has an annular base made of a metal material such as an aluminum alloy and an annular cutting edge formed along an outer circumferential edge portion of the base. The cutting edge of the hub blade may be an electroformed grindstone made of abrasive grains bound together by a bonding material such as a nickel-plated body. The cutting blade 40 may alternatively be a washer-type cutting blade which is also known as a washer blade. The washer blade is of a structure that has only an annular cutting edge made of abrasive grains bound together by a bonding material such as metal, ceramic, or resin.

The moving unit 22 moves the cutting blade 40 of the processing unit 38 along the Y-axis and the Z-axis to adjust the position of the cutting blade 40 in the indexing feed directions and the depth to which the cutting blade 40 cuts into the workpiece 11, i.e., the wafer 13.

An image capturing unit 42 for capturing an image of the workpiece 11 held on the chuck table 10 is provided in a position adjacent to the processing unit 38. The image capturing unit 42 may be a camera, e.g., a visible light camera or an infrared ray camera, that includes an optical microscope and an image capturing device such as a charge-coupled device (CCD) sensor or a complementary metal-oxide-semiconductor (CMOS) sensor. An image of the workpiece 11 held on the chuck table 10 is captured by the image capturing unit 42, and the captured image will be used in a step of positioning the workpiece 11 and the cutting blade 40 with respect to each other, for example.

The base 4 also has a circular opening 4c defined in the upper surface thereof at a position across the opening 4b from the opening 4a. The opening 4c provides a cylindrical cleaning space or cleaning chamber in the base 4. The opening 4c houses therein a cleaning apparatus, i.e., a cleaning mechanism, 44 for cleaning the workpiece 11.

For processing the workpiece 11 on the cutting apparatus 2, one of the workpieces 11 stored in the cassette 8 is taken out and delivered by a delivery mechanism, not illustrated, to the chuck table 10, and the workpiece 11 is then held on the chuck table 10. Specifically, the workpiece 11 is placed on the holding surface 10a such that the face side 13a of the wafer 13 faces upwardly and the reverse side 13b thereof faces the holding surface 10a with the sheet 21 interposed therebetween. The outer circumferential portion, i.e., the frame 19, of the workpiece 11 is then secured in place by the clamps 18. Then, a suction force, i.e., a negative pressure, from the suction source is applied through the suction channel and the valve to the holding surface 10a, holding the wafer 13 under suction on the chuck table 10 with the sheet 21 interposed therebetween.

Now, the processing unit 38 processes the workpiece 11 on the chuck table 10. The processing unit 38 cuts the workpiece 11 by rotating the cutting blade 40 and causing the cutting blade 40 to cut into the workpiece 11. For example, the cutting blade 40 incises the wafer 13 to a depth exceeding the thickness of the wafer 13, cutting the wafer 13 along the streets 15 (see FIG. 2). As the cutting blade 40 cuts into the wafer 13 to the depth larger than the thickness of the wafer 13, the wafer 13 is divided into a plurality of device chips having the respective devices 17 (see FIG. 2). At this time, the device chips remain held together by the sheet 21. The workpiece 11 thus processed by the processing unit 38 is delivered by a delivery mechanism, not illustrated, to the cleaning apparatus 44 where the workpiece 11 is cleaned. After the workpiece 11 has been cleaned by the cleaning apparatus 44, the workpiece 11 is delivered by the delivery mechanism, not illustrated, to the cassette 8 where the workpiece 11 is stored back.

When the cutting apparatus 2 processes the workpiece 11, foreign matter such as particles of dirt or dust that are present in the cutting apparatus 2 and debris or swarf that is produced from the workpiece 11 as it is processed may be deposited on the workpiece 11. Therefore, the processed workpiece 11 is cleaned by the cleaning apparatus 44 before it is stored back into the cassette 8. The cleaning apparatus 44 is a cleaning mechanism that is capable of cleaning both the face side of the workpiece 11, i.e., the face side 13a of the wafer 13, and the reverse side of the workpiece 11, i.e., a lower surface of the sheet 21. When the cleaning apparatus 44 cleans the workpiece 11, foreign matter that may have been deposited on the face and reverse sides of the workpiece 11 is washed away, so that the workpiece 11 is prevented from being contaminated by foreign matter and foreign matter is prevented from entering the cassette 8 via the workpiece 11.

Figure 3:
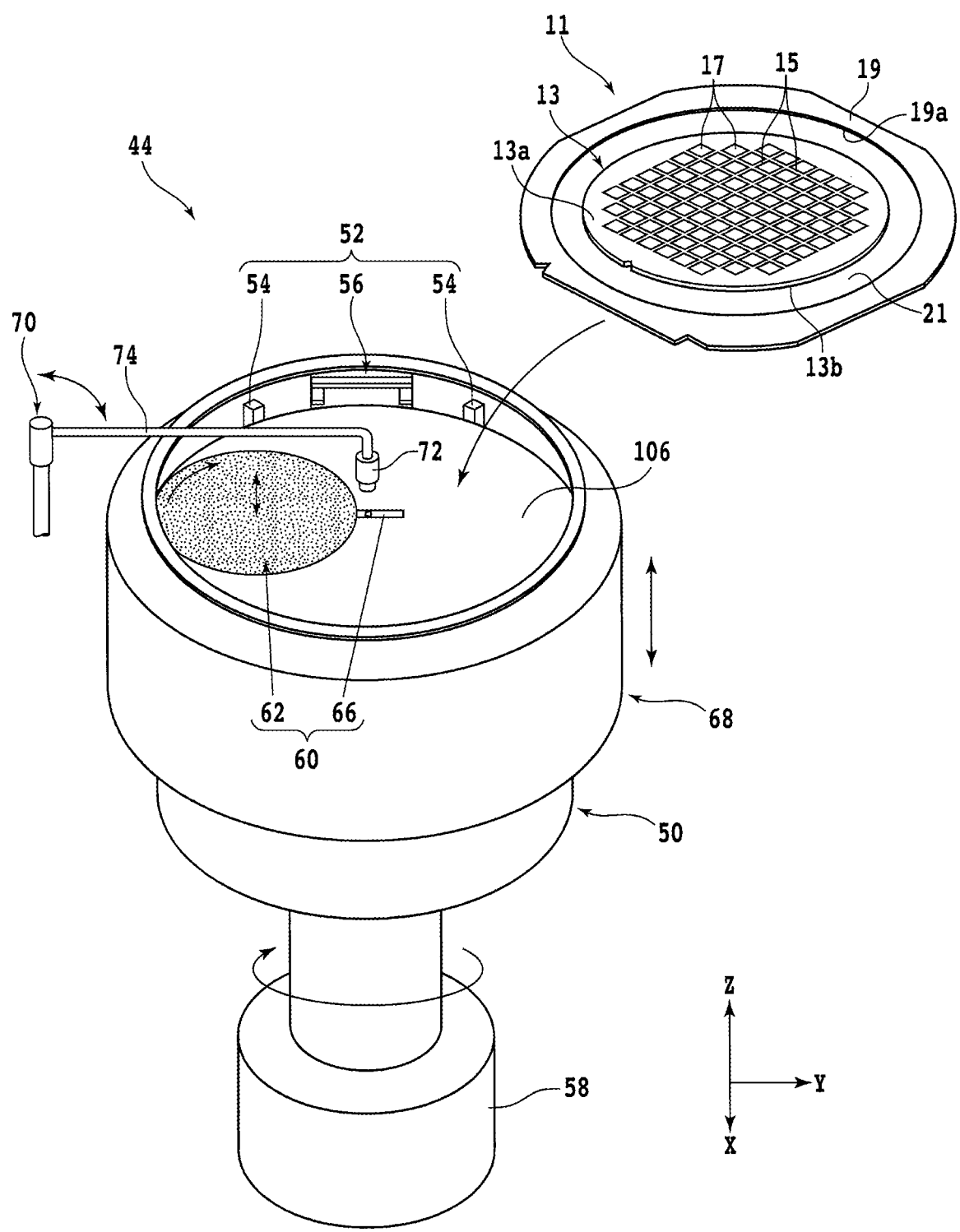
FIG. 3 is a perspective view of a cleaning apparatus incorporated in the cutting apparatus.

FIG. 3 illustrates the cleaning apparatus 44 in perspective. As illustrated in FIG. 3, the cleaning apparatus 44 includes a spinner table 50 for holding and rotating the workpiece 11 about its central axis, an annular cover 68 surrounding the spinner table 50, and a cleaning unit 70 for supplying a cleaning fluid to the workpiece 11 held on the spinner table 50 to clean the workpiece 11.

The spinner table 50 includes a holding unit, i.e., a holding mechanism, 52 for holding the outer circumferential portion, i.e., the frame 19, of the workpiece 11. The holding unit 52 includes, for example, a plurality of support members 54 for supporting the outer circumferential portion of the workpiece 11 and a plurality of securing mechanisms, i.e., clamp mechanisms, 56 for holding and securing the outer circumferential portion of the workpiece 11 supported by the support members 54.

Each of the support members 54 is a columnar pin made of metal, resin, or the like, for example. The holding unit 52 includes three or more support members 54 arranged in an annular pattern around the outer circumferential portion, i.e., the frame 19, of the workpiece 11. The support members 54 have upper surfaces that are flat surfaces generally parallel to the horizontal plane or XY plane. The upper surfaces of the support members 54 lie substantially flush with each other and jointly provide a support surface for supporting thereon the outer circumferential portion of the workpiece 11. When the workpiece 11 is placed on the spinner table 50, the outer circumferential portion of the workpiece 11 is supported generally horizontally on the support members 54. Each of the securing mechanisms 56 is a clamp mechanism for holding down the outer circumferential portion, i.e., the frame 19, of the workpiece 11, for example. The holding unit 52 includes two or more securing mechanisms 56 that are each positioned between adjacent two of the support members 54. When the securing mechanisms 56 hold down a face side, i.e., an upper surface, of the outer circumferential portion of the workpiece 11 supported on the support members 54, the outer circumferential portion of the workpiece 11 is gripped and sandwiched between the support members 54 and the securing mechanisms 56. In this manner, the workpiece 11 is securely held on the spinner table 50. The support members 54 and the securing mechanisms 56 are not limited to any particular quantities, layouts, etc. For example, the holding unit 52 may include four securing mechanisms 56 provided in an annular array at spaced intervals of 90° and eight support members 54 each positioned one on each side of each of the securing mechanisms 56.

The spinner table 50 is coupled to a rotating mechanism 58 for rotating the spinner table 50. The rotating mechanism 58 includes a rotary actuator such as an electric motor for rotating the spinner table 50 about its vertical central axis generally parallel to the Z-axis. When the rotating mechanism 58 is energized, it rotates the holding unit 52, which includes the support members 54 and the securing mechanisms 56, while the holding unit 52 holds the outer circumferential portion of the workpiece 11, thereby rotating the workpiece 11 in unison therewith.

The spinner table 50 includes a cleaning unit 60 for cleaning the reverse side, i.e., the lower surface, of the workpiece 11. The cleaning unit 60 includes a cleaning member 62 for contacting the reverse side of the workpiece 11 and a drive mechanism 64 (see FIGS. 4A and 5A) for moving the cleaning member 62 toward and away from the reverse side of the workpiece 11 and rotating the cleaning member 62 about its vertical central axis.

The cleaning member 62 is a disk-shaped member whose diameter is equal to or larger than the radius of the wafer 13, and is disposed within the holding unit 52, i.e., radially inwardly of the support members 54 and the securing mechanisms 56. The workpiece 11 is placed on the spinner table 50 such that the wafer 13 and the sheet 21 have respective portions lying over the cleaning member 62. The cleaning member 62 is not limited to any particular shapes, and may be a columnar member whose length is equal to or larger than the radius of the wafer 13, for example.

The cleaning unit 60 includes a nozzle 66 for supplying a cleaning fluid to the cleaning member 62. For example, the nozzle 66 is disposed adjacent to the cleaning member 62 and is fluidly connected to a cleaning fluid supply source, not illustrated, that supplies the cleaning fluid to the nozzle 66. The cleaning fluid may be a liquid such as pure water or may be a mixed fluid of a liquid such as pure water and a gas such as air.

For cleaning the workpiece 11 with the cleaning unit 60, the nozzle 66 ejects the cleaning fluid toward the cleaning member 62, thereby supplying the cleaning fluid to the workpiece 11 and the cleaning member 62. The drive mechanism 64 (see FIGS. 4A and 5A) is actuated to lift the cleaning member 62 toward the workpiece 11 and rotate the cleaning member 62 about its vertical central axis. The cleaning member 62 is now brought into contact with the reverse side, i.e., the lower surface, of the workpiece 11 and rubs against the reverse side of the workpiece 11, thereby cleaning the reverse side of the workpiece 11. Details of the operation of the cleaning unit 60 will be described later.

The annular cover 68 is disposed around the spinner table 50 in surrounding relation to an upper portion of the spinner table 50. The cover 68 is coupled to a lifting and lowering mechanism, not illustrated, such as an air cylinder for lifting and lowering the cover 68 along the Z-axis. When the workpiece 11 is to be delivered to and from the spinner table 50, the lifting and lowering mechanism lowers the cover 68 to a position, i.e., a delivery position, where the holding unit 52 is exposed. The cover 68 lowered to the delivery position makes it easy to deliver the workpiece 11 to and from the spinner table 50. When the workpiece 11 is to be cleaned by the cleaning apparatus 44, the lifting and lowering mechanism lifts the cover 68 to a position, i.e., a cleaning position, where the workpiece 11 and the holding unit 52 are covered by the cover 68. The cover 68 lifted to the cleaning position blocks the cleaning fluid from being scattered out of the spinner table 50 while the workpiece 11 is cleaned.

The cleaning unit 70 for supplying the cleaning fluid to the workpiece 11 to clean the face side of the workpiece 11, i.e., the face side 13a of the wafer 13, is disposed above the spinner table 50. The cleaning unit 70 includes a nozzle 72 for supplying the cleaning fluid to the face side of the workpiece 11. The nozzle 72 is fluidly connected to a cleaning fluid supply source, not illustrated, that supplies the cleaning fluid to the nozzle 72. The cleaning fluid may be a liquid such as pure water or may be a mixed fluid of a liquid such as pure water and a gas such as air.

The nozzle 72 is mounted on an L-shaped support arm 74 in the form of a pipe. The nozzle 72 is fluidly connected to the cleaning fluid supply source through the support arm 74. The support arm 74 has a distal end, i.e., an end, to which the nozzle 72 is fixed and a proximal end, i.e., the other end, coupled to a rotary actuator, not illustrated, such as an electric motor for turning the support arm 74 in horizontal directions. When the rotary actuator is energized, it turns the support arm 74 between a position, i.e., a supply position, where the nozzle 72 is positioned over the spinner table 50 and a position, i.e., a retracted position, where the nozzle 72 is positioned radially off the spinner table 50.

For cleaning the workpiece 11 with the cleaning apparatus 44, the rotating mechanism 58 rotates the spinner table 50 that is holding the workpiece 11 thereon. Then, the nozzle 72 supplies the cleaning fluid to the face side of the workpiece 11, i.e., the face side 13a of the wafer 13, thereby cleaning the upper surface of the workpiece 11. The nozzle 66 ejects the cleaning fluid toward the workpiece 11 and the cleaning member 62, and the cleaning member 62 that is being rotated is brought into contact with the reverse side of the workpiece 11, i.e., the lower surface of the sheet 21. The reverse side of the workpiece 11, i.e., the lower surface thereof, is now cleaned.

As described above, the cleaning apparatus 44 can simultaneously clean both the face side, i.e., the upper surface, of the workpiece 11 and the reverse side, i.e., the lower surface, of the workpiece 11. In this manner, foreign matter that may have been deposited on the workpiece 11 is reliably removed, preventing the workpiece 11 that has been processed from being contaminated. In addition, the processed workpieces 11 with foreign matter deposited thereon are prevented from being introduced into the cassette 8 (see FIG. 1), protecting other workpieces 11 in the cassette 8 against contamination. The structural details of the cleaning unit 70 may be changed or modified as long as the changes or modifications would not make the cleaning unit 70 unable to clean the face side of the workpiece 11. For example, the nozzle 72 may be replaced with a cleaning member of sponge, non-woven fabric, brush, or the like for rubbing against the face side of the workpiece 11 to clean the face side of the workpiece 11 while being rotated and kept in contact with the face side of the workpiece 11.

Figure 4A:
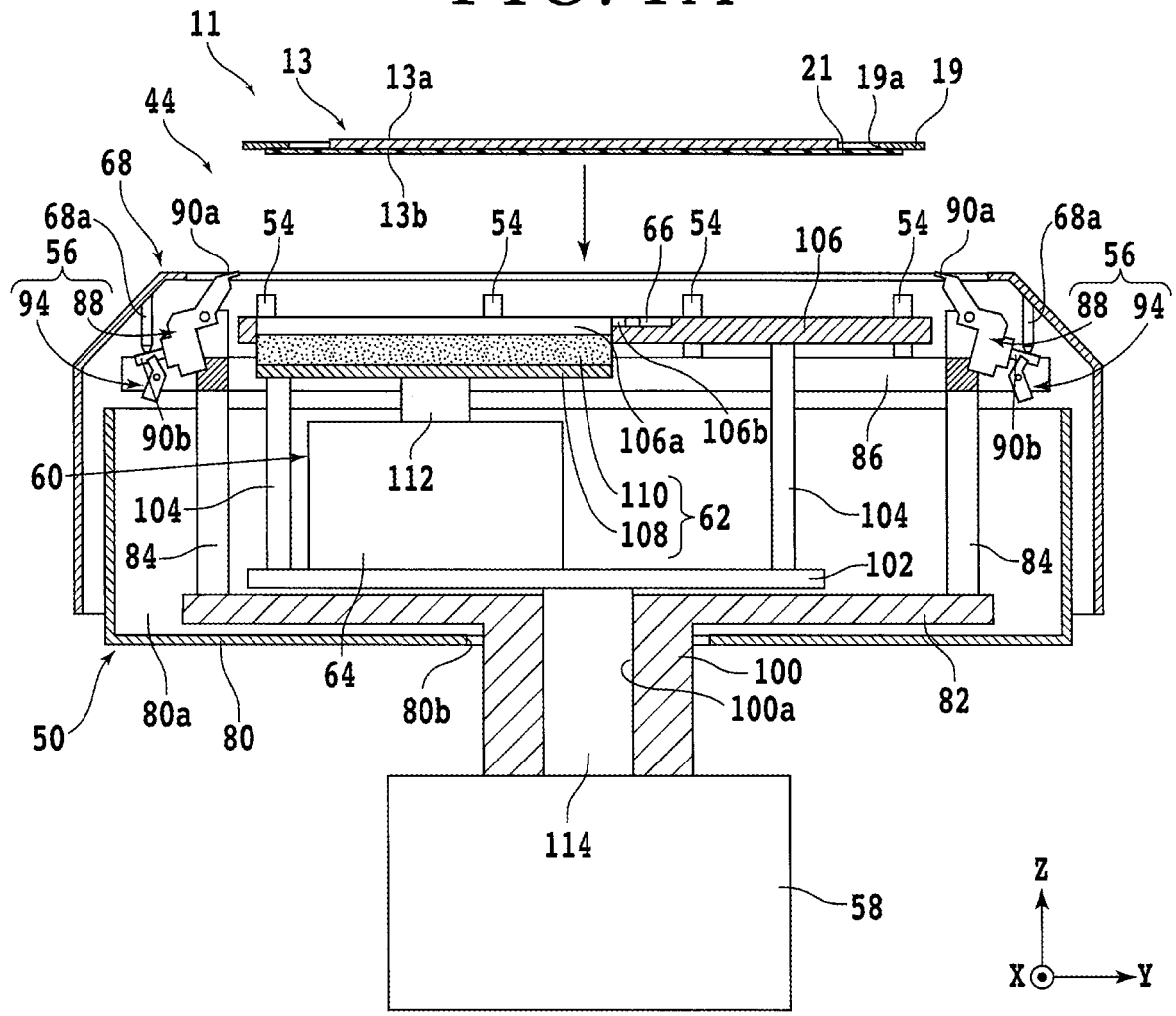
FIG. 4A is a front elevational view, partly in cross section, of the cleaning apparatus at the time when the workpiece is introduced into the cleaning apparatus.

Details of the structure and operation of the cleaning apparatus 44 will be described below. FIG. 4A illustrates in front elevation, partly in cross section, the cleaning apparatus 44 at the time when the workpiece 11 is introduced into the cleaning apparatus 44. As illustrated in FIG. 4A, the spinner table 50 includes a hollow cylindrical case 80 defining therein a cylindrical storage space, i.e., a cavity, 80a capable of accommodating therein the structural members of the spinner table 50.

The storage space 80a accommodates a disk-shaped first support table 82 therein. A plurality of first support posts 84 are fixedly mounted on an upper surface of an outer circumferential portion of the first support table 82. The first support posts 84 are columnar members made of metal, resin, or the like and are arrayed at generally equal spaced intervals along an outer circumferential edge of the first support table 82. An annular support plate 86 is fixed to upper end portions of the first support posts 84. The support plate 86 is an annular member made of metal, resin, or the like and supports the holding unit 52 (see FIG. 3) thereon. Specifically, the support members 54 are fixed to an upper surface of the support plate 86. The securing mechanisms 56 are coupled to an outer circumferential portion of the support plate 86.

Figure 4B:
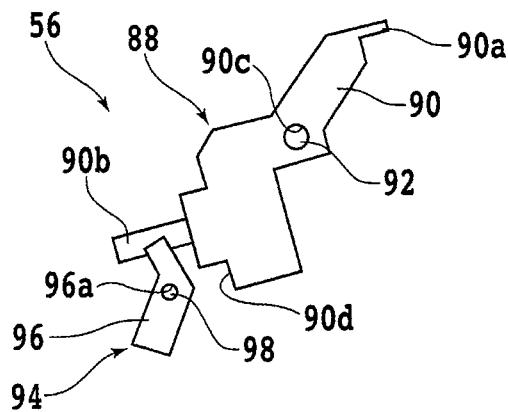
FIG. 4B is a front elevational view of a securing mechanism of the cleaning apparatus at the time when the workpiece is introduced into the cleaning apparatus.

FIG. 4B illustrates in plan each of the securing mechanisms 56 at the time when the workpiece 11 is introduced into the cleaning apparatus 44. As illustrated in FIG. 4B, each securing mechanism 56 includes a clamp 88 for clamping the workpiece 11 in position and a lock mechanism 94 for locking the clamp 88 against movement.

The clamp 88 includes an arm 90 for pressing the outer circumferential portion of the workpiece 11 and a joint shaft 92 by which the arm 90 is joined to the support plate 86. The arm 90 has a presser 90a on one end thereof for pressing down the face side of the workpiece 11 by contacting the workpiece 11, i.e., the frame 19. The arm 90 also has a pressed member, i.e., a pressed pin, 90b on the other end thereof for being pressed by a pressing pin 68a to be described later. The presser 90a should preferably be made of a soft material such as rubber or resin to avoid damaging the workpiece 11 when the presser 90a contacts the workpiece 11. The joint shaft 92, which is a cylindrical member fixed to the support plate 86 or a joint member joined to the support plate 86, is inserted in a through hole 90c defined in the arm 90. When the arm 90 is placed on the joint shaft 92 such that the joint shaft 92 extends through the through hole 90c, the arm 90 is pivotally mounted on the support plate 86 for pivotal movement about the joint shaft 92.

The arm 90 is oriented with respect to the support plate 86 such that the presser 90a is directed radially toward the center of the support plate 86 and the pressed member 90b is directed radially outwardly of the support plate 86. The through hole 90c in the arm 90 is positioned closer to the pressed member 90b, i.e., farther from the presser 90a, than the center of gravity of the arm 90. Therefore, when no external force is applied to the arm 90, the clamp 88 pivots about the joint shaft 92 such that the presser 90a descends and the pressed member 90b ascends under the weight of the arm 90.

The lock mechanism 94 includes a locking block 96 for locking the clamp 88 against movement and a joint shaft 98 by which the locking block 96 is joined to the support plate 86. The joint shaft 98 is a cylindrical member fixed to the support plate 86 or a joint member joined to the support plate 86 and is inserted in a through hole 96a defined in the locking block 96. When the locking block 96 is placed on the joint shaft 98 such that the joint shaft 98 extends through the through hole 96a, the locking block 96 is pivotally mounted on the support plate 86 for pivotal movement about the joint shaft 98.

The first support table 82 is coupled to the rotating mechanism 58 by a cylindrical spindle 100. Specifically, the case 80 has an insertion hole 80b defined centrally in a bottom panel thereof and joining spaces in and out of the case 80. The spindle 100 is inserted through the insertion hole 80b. The spindle 100 has an upper end coupled centrally to the first support table 82 and a lower end coupled to the output shaft of the rotary actuator of the rotating mechanism 58. When the rotary actuator of the rotating mechanism 58 is energized, its rotary power is transmitted through the spindle 100 to the first support table 82, rotating the components, i.e., the first support posts 84, the support plate 86, the support members 54, and the securing mechanisms 56, coupled to the first support table 82 about a rotational shaft generally parallel to the Z-axis.

A disk-shaped second support table 102 is housed in the storage space 80a in the case 80. The second support table 102 is disposed above and spaced from the first support table 82. A plurality of second support posts 104 are fixedly mounted on an upper surface of an outer circumferential portion of the second support table 102. The second support posts 104 are columnar members made of metal, resin, or the like and are arrayed at generally equal spaced intervals along an outer circumferential edge of the second support table 102.

A disk-shaped cover plate 106 made of metal, resin, or the like is fixed to upper end portions of the second support posts 104. The cover plate 106 has a cylindrical opening 106a defined therein and extending thicknesswise through the cover plate 106. For example, the opening 106a extends radially from an outer circumferential portion of the cover plate 106 toward the center of the cover plate 106. The nozzle 66 is fitted in an upper surface of a central area of the cover plate 106. The nozzle 66 is fluidly connected to the opening 106a through a fluid channel 106b defined in the upper surface of the cover plate 106.

The second support table 102 supports the cleaning unit 60 thereon. The cleaning member 62 of the cleaning unit 60 is inserted in the opening 106a in the cover plate 106. The cleaning member 62 includes a disk-shaped base 108 made of metal, resin, or the like and a disk-shaped contact member 110 fixed to an upper surface of the base 108. The contact member 110 is a soft member made of sponge, non-woven fabric, brush, or the like, and contacts the reverse side of the workpiece 11 to rub against the reverse side of the workpiece 11.

The cleaning member 62 is coupled to the drive mechanism 64 by a cylindrical spindle 112. The drive mechanism 64 includes a rotary actuator such as an electric motor and a lifting and lowering mechanism, not illustrated, such as an air cylinder that selectively lifts and lowers the rotary actuator. The spindle 112 has an upper end coupled centrally to the cleaning member 62 and a lower end coupled to the output shaft of the rotary actuator of the drive mechanism 64 and also to the lifting and lowering mechanism thereof. When the rotary actuator of the drive mechanism 64 is energized, it rotates the spindle 112, rotating the cleaning member 62 about its central axis generally parallel to the Z-axis. When the lifting and lowering mechanism of the drive mechanism 64 is actuated, it lifts or lowers the cleaning member 62 in the opening 106a toward or away from the reverse side of the workpiece 11 held on the spinner table 50.

The second support table 102 is supported on a cylindrical third support post 114. The third support post 114 is inserted through a cylindrical insertion hole 100a defined centrally in the spindle 100 and extending longitudinally through the spindle 100. The third support post 114 has an upper end coupled centrally to the second support table 102 and a lower end fixed to the rotating mechanism 58. Specifically, the third support post 114 is fixed to a housing or the like of the rotating mechanism 58, but is not coupled to the output shaft of the rotary actuator of the rotating mechanism 58. Therefore, when the rotating mechanism 58 is actuated to rotate the spindle 100 about its longitudinal central axis, the second support table 102 is not rotated. Consequently, the rotating mechanism 58 can rotate the holding unit 52, i.e., the support members 54 and the securing mechanisms 56, without changing the positions of the cleaning unit 60 and the cover plate 106.

The cover 68 is disposed in surrounding relation to the spinner table 50. A plurality of pressing pins 68a are mounted on an outer circumferential portion of an upper end portion of the cover 68. The pressing pins 68a are columnar members protruding downwardly from an inner wall surface of the cover 68. There are as many pressing pins 68a as the number of the securing mechanisms 56. The pressing pins 68a are disposed in vertical alignment with the respective pressed members 90b that are located within the cover 68.

For holding the workpiece 11 on the spinner table 50, the cover 68 is lowered into the delivery position. At this time, the pressing pins 68a press the pressed members 90b of the arms 90 downwardly. As a result, the arms 90 are turned such that the pressers 90a are raised and the pressed members 90b are lowered. The clamps 88 are opened into a position, i.e., a releasing position, for releasing the workpiece 11. Then, the workpiece 11 is delivered onto the spinner table 50. At this time, the workpiece 11 is placed on the support members 54 such that the face side of the workpiece 11, i.e., the face side 13a of the wafer 13, faces upwardly and the reverse side of the workpiece 11, i.e., the lower surface of the sheet 21, faces downwardly, that is, faces the cover plate 106. In this manner, the outer circumferential portion, i.e., the frame 19, of the workpiece 11 is supported on the support members 54.

Figure 5A:
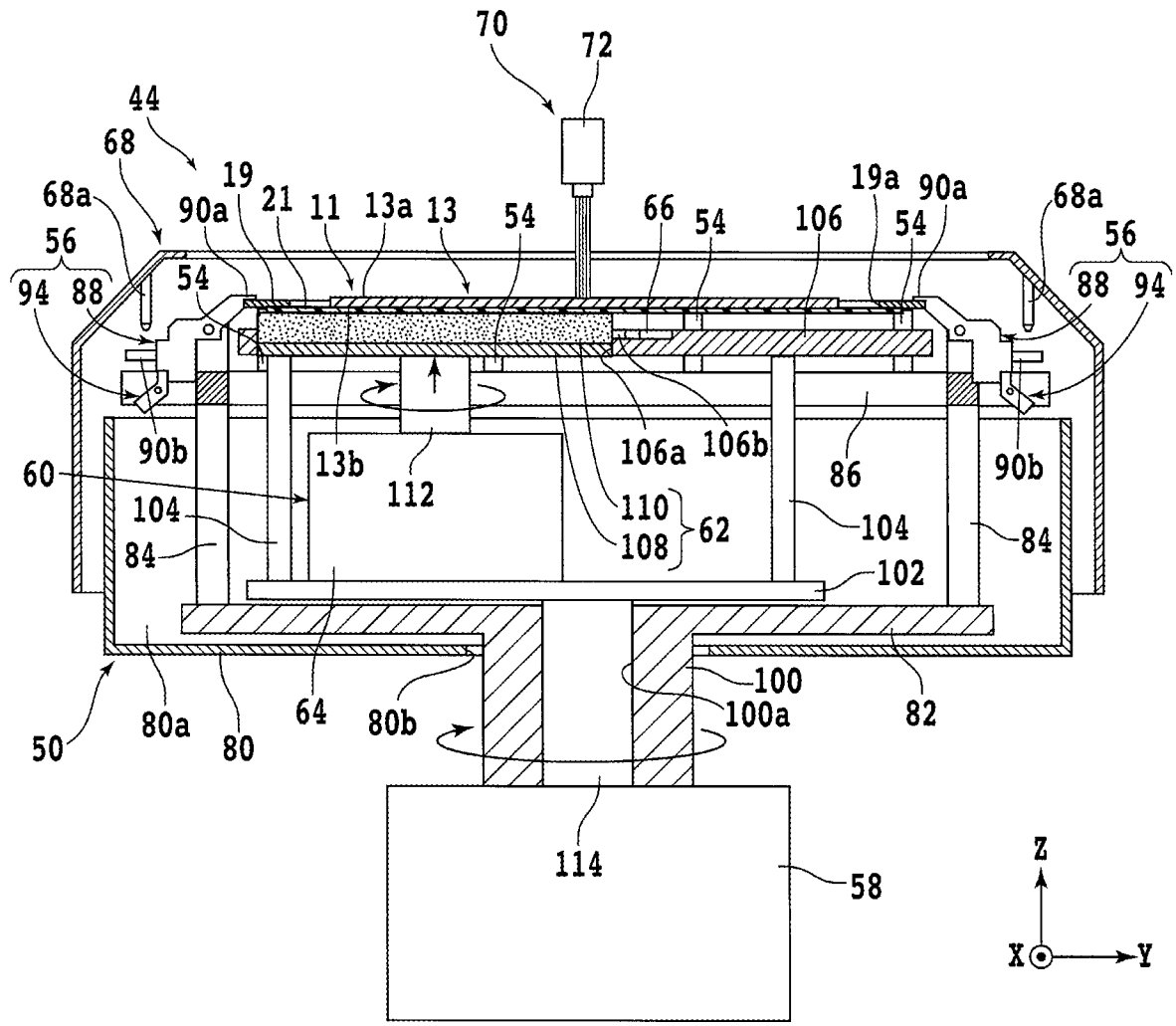
FIG. 5A is a front elevational view, partly in cross section, of the cleaning apparatus at the time when the workpiece is cleaned by the cleaning apparatus.

FIG. 5A illustrates in front elevation, partly in cross section, the cleaning apparatus 44 at the time when the workpiece 11 is cleaned. When the workpiece 11 has been placed on the spinner table 50, the cover 68 is lifted into the cleaning position. At this time, the pressing pins 68a are spaced from the pressed members 90b of the arms 90, releasing the arms 90 from their pressed state. The arms 90 are turned such that the pressers 90a are lowered and the pressed members 90b are raised. The clamps 88 are now closed into a position, i.e., a securing position, for securing the workpiece 11. As a consequence, the pressers 90a press the outer circumferential portion, i.e., the frame 19, of the workpiece 11 downwardly, so that the support members 54 and the securing mechanisms 56 sandwich the workpiece 11 therebetween.

Figure 5B:
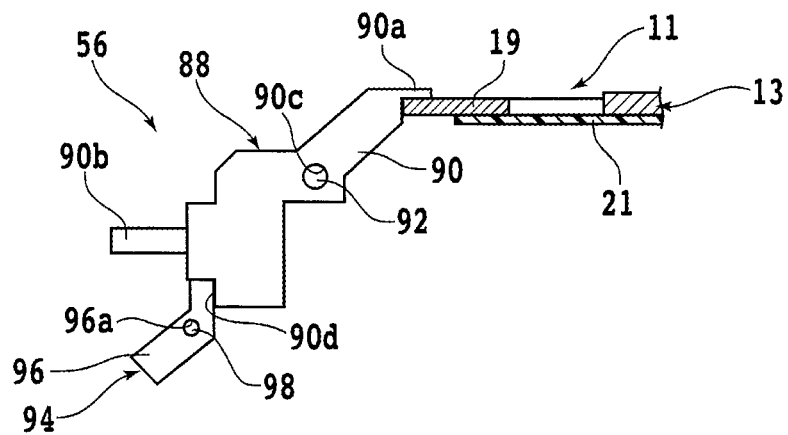
FIG. 5B is a front elevational view of the securing mechanism at the time when the workpiece is cleaned by the cleaning apparatus.

Next, the rotating mechanism 58 is actuated to rotate the spindle 100 about its longitudinal central axis. The first support table 82, the support members 54, and the securing mechanisms 56 are rotated, rotating the workpiece 11 that is sandwiched between the support members 54 and the securing mechanisms 56. FIG. 5B illustrates in plan each of the securing mechanisms 56 at the time when the workpiece 11 is cleaned by the cleaning apparatus 44. When the securing mechanisms 56 are rotated, centrifugal forces act on the clamps 88, pulling the pressed members 90b radially outwardly of the support plate 86. As a result, downward forces are applied to the pressers 90a, pressing the pressers 90a downwardly against the outer circumferential portion of the workpiece 11. The workpiece 11 is now reliably secured to the spinner table 50.

When the spinner table 50 is rotated, centrifugal forces also act on the lock mechanisms 94 disposed adjacent to the clamps 88, pulling the lower ends of the locking blocks 96 radially outwardly of the support plate 86. As a result, the upper ends of the locking blocks 96 enter respective recesses 90d defined in the lower ends of the arms 90, so that the arms 90 and the locking blocks 96 are interfitted together. The arms 90 are now prevented from being moved, i.e., turned, thereby locking the clamps 88 placed in the securing position.

Then, the nozzle 72 of the cleaning unit 70 is positioned in a supply position in vertical alignment with the central area of the workpiece 11, and drops the cleaning fluid such as pure water toward the face side of the workpiece 11. The cleaning fluid is supplied to the central area of the workpiece 11 and then flows radially outward from the central area of the workpiece 11 toward the outer circumferential edge thereof under centrifugal forces. As a result, foreign matter that may have been deposited on the face side of the workpiece 11 is washed away. In addition, the nozzle 66 ejects the cleaning fluid toward the cleaning member 62 and the reverse side of the workpiece 11 while the drive mechanism 64 rotates and lifts the cleaning member 62. The cleaning member 62 is pressed against the reverse side of the workpiece 11, i.e., the lower surface of the sheet 21. The cleaning member 62 is thus rotated in rubbing contact with the reverse side of the workpiece 11. As a consequence, foreign matter that may have been deposited on the reverse side of the workpiece 11 is washed away. Providing the reverse side of the workpiece 11 can sufficiently be cleaned by the rotation of only the workpiece 11, the cleaning member 62 may be kept in contact with the reverse side of the workpiece 11 without being rotated.

While the workpiece 11 is thus cleaned, the cleaning member 62 contacts the workpiece 11 in a manner to press the workpiece 11 upwardly, because the cleaning member 62 is lifted by the lifting and lowering mechanism. However, since the clamps 88 are locked by the lock mechanisms 94 as described above, the clamps 88 are prevented from being moved or turned (see FIG. 5B). When the workpiece 11 is pressed by the cleaning member 62, therefore, the clamps 88 prevent the workpiece 11 from being released from its secured state. Moreover, as the reverse side of the workpiece 11 is borne by the cleaning member 62 while the workpiece 11 is cleaned, the central area of the workpiece 11 is prevented from flexing downwardly though it is pressed downwardly by the cleaning fluid ejected from the nozzle 72 to the face side of the workpiece 11.

When the workpiece 11 has been cleaned, the spinner table 50 and the cleaning member 62 stop being rotated. The cover 68 is lowered into the delivery position, causing the pressing pins 68a to press the pressed members 90b of the arms 90. The clamps 88 are turned into the releasing position, releasing the workpiece 11 from the securing mechanisms 56. Thereafter, the workpiece 11 is delivered from the spinner table 50 back into the cassette 8 (see FIG. 1).

As described above, the cleaning apparatus 44 according to the present embodiment includes the cleaning unit 60 that is capable of cleaning the reverse side of the workpiece 11. Consequently, foreign matter that may have been deposited on the reverse side of the workpiece 11 is reliably removed, so that the workpiece 11 is prevented from being contaminated by foreign matter.

According to the present embodiment, the cutting apparatus 2 (see FIG. 1) is illustrated as a processing apparatus incorporating the cleaning apparatus 44. However, the cleaning apparatus 44 may be incorporated in another processing apparatus. For example, the cleaning apparatus 44 may be incorporated in a grinding apparatus including a processing unit, i.e., a grinding unit, for grinding the workpiece 11, a polishing apparatus including a processing unit, i.e., a polishing unit, for polishing the workpiece 11, a laser processing apparatus including a processing unit, i.e., a laser beam applying unit, for applying a laser beam to the workpiece 11, or other apparatuses.

The grinding unit of the grinding apparatus includes a spindle having a distal end on which there is mounted an annular grinding wheel that includes a plurality of grindstones. The grinding unit grinds the workpiece 11 by bringing the grindstones into abrasive contact with the workpiece 11 while rotating the grinding wheel. The polishing unit of the polishing apparatus includes a spindle having a distal end with a disk-shaped grinding pad mounted thereon. The polishing unit polishes the workpiece 11 by bringing the polishing pad into contact with the workpiece 11 while rotating the polishing pad.

The laser beam applying unit of the laser processing apparatus includes a laser oscillator for emitting a laser beam having a predetermined wavelength and an optical system for guiding the laser beam emitted from the laser oscillator to the workpiece 11. The laser processing apparatus processes the workpiece 11 with the laser beam emitted from the laser oscillator and applied to the workpiece 11.

Further, the cleaning apparatus 44 may be incorporated in a plasma treating apparatus for performing plasma etching on the workpiece 11. The plasma treating apparatus etches the workpiece 11 by supplying a plasmatized etching gas to the workpiece 11.

In either the grinding apparatus, the polishing apparatus, the laser processing apparatus, or the plasma treating apparatus, the processed workpiece 11 is cleaned and is then stored in a cassette. The cleaning apparatus 44 incorporated in any of these processing apparatuses can clean the face and reverse sides of the workpiece 11 before the workpiece 11 is stored in the cassette.

The structure, method, etc., according to the above embodiment may be changed or modified without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cleaning apparatus for cleaning a workpiece, comprising:
   a spinner table for holding and rotating the workpiece about a central axis;
   a holding unit for holding an outer circumferential portion of the workpiece thereon, wherein the holding unit includes a securing mechanism and a plurality of support members, where the support members are configured to support a reverse side of the workpiece;
   a rotating mechanism for rotating the spinner table, and wherein the securing mechanism and the plurality of support members are configured to rotate with the spinner table about the central axis; and
   a cleaning unit for cleaning the reverse side of the workpiece,
   wherein the cleaning unit includes a cleaning member for contacting the reverse side of the workpiece and a drive mechanism for moving the cleaning member toward and away from the reverse side of the workpiece.

2. The cleaning apparatus according to claim 1, wherein the drive mechanism rotates the cleaning member.

3. The cleaning apparatus according to claim 1, wherein the securing mechanism of the holding unit includes a clamp that is movable selectively into a securing position for securing the workpiece and a releasing position for releasing the workpiece, and a lock mechanism for locking the clamp placed in the securing position.

4. The cleaning apparatus according to claim 1, wherein the cleaning unit further includes a nozzle for supplying a fluid to the cleaning member.

5. The cleaning apparatus according to claim 1, wherein:
   the workpiece includes a wafer, a sheet fixed to the wafer, and an annular frame supporting the wafer through the sheet,
   the holding unit holds the frame thereon, and
   the cleaning unit cleans the sheet.

6. A cleaning apparatus for cleaning a workpiece, comprising:
- a holding unit for holding an outer circumferential portion of the workpiece thereon;
- a rotating mechanism for rotating the holding unit about an axis that is parallel to a z-axis; and
- a cleaning unit for cleaning a reverse side of the workpiece,
- wherein the cleaning unit includes a cleaning member for contacting the reverse side of the workpiece and a drive mechanism for moving the cleaning member toward and away from the reverse side of the workpiece, and
- wherein the drive mechanism rotates the cleaning member about an axis that is parallel to the z-axis.

7. A cleaning apparatus for cleaning a workpiece, comprising:
- a holding unit for holding an outer circumferential portion of the workpiece thereon;
- a rotating mechanism for rotating the holding unit; and
- a cleaning unit for cleaning a reverse side of the workpiece,
- wherein the cleaning unit includes a cleaning member for contacting the reverse side of the workpiece and a drive mechanism for moving the cleaning member toward and away from the reverse side of the workpiece, and
- wherein the holding unit includes a clamp that includes an arm with a presser on one end thereof, and where the arm is selectively pivotable about a shaft into a securing position for securing the workpiece, where the presser downwardly presses the workpiece, and a releasing position for releasing the workpiece, and a lock mechanism for locking the clamp placed in the securing position.

8. The cleaning apparatus according to claim 7, wherein the lock mechanism includes a lock block that is pivotable about an axis.

9. The cleaning apparatus according to claim 8, wherein when the holding unit is rotated by the rotating mechanism, centrifugal forces act on the arm and the lock block to both pivot such that an upper end of the lock block enters a recess defined in a lower end of the arm.

10. The cleaning apparatus according to claim 1, further comprising an additional cleaning unit configured for cleaning a face side of the workpiece, wherein the face side and the reverse side face opposite directions from each other.

11. The cleaning apparatus according to claim 10, wherein the additional cleaning unit comprises a nozzle that is fixed to a distal end of a support arm.

12. The cleaning apparatus according to claim 1, further comprising:
- a spindle configured and arranged to transfer rotary motion from the rotating mechanism to the spinner table;
- a support post provided within a cylindrical hole that extends through the spindle, whereby the spindle rotates with respect to the support post;
- a disk-shaped cover plate associated with the support post such that the disk-shaped cover plate does not rotate with the spindle; and
- a nozzle fitted into an upper surface of the disk-shaped cover plate, wherein the nozzle is configured and arranged to eject cleaning fluid toward the cleaning member.

* * * * *